United States Patent
Mweene

(10) Patent No.: US 12,483,235 B2
(45) Date of Patent: Nov. 25, 2025

(54) VOLTAGE GATE DRIVER FOR A SEMICONDUCTOR-BASED TRANSISTOR, AS WELL AS A POWER SWITCH DEVICE, AND A CORRESPONDING METHOD

(71) Applicants: NEXPERIA B.V., Nijmegen (NL); Nexperia Technology (Shanghai) Ltd., Shanghai (CN)

(72) Inventor: Loveday Haachitaba Mweene, Santa Clara, CA (US)

(73) Assignees: NEXPERIA B.V., Nijmegen (NL); Nexperia Technology (Shanghai) Ltd., Shanghai (CN)

( * ) Notice: Subject to any disclaimer, the term of this patent is extended or adjusted under 35 U.S.C. 154(b) by 203 days.

(21) Appl. No.: 18/458,615

(22) Filed: Aug. 30, 2023

(65) Prior Publication Data

US 2024/0072788 A1 Feb. 29, 2024

(30) Foreign Application Priority Data

Aug. 31, 2022 (EP) .................................... 22193040

(51) Int. Cl.
 *H03K 17/10* (2006.01)
(52) U.S. Cl.
 CPC ................. *H03K 17/102* (2013.01)
(58) Field of Classification Search
 None
 See application file for complete search history.

(56) References Cited

U.S. PATENT DOCUMENTS

| | | | | |
|---|---|---|---|---|
| 7,714,548 B1* | 5/2010 | Wittenbreder, Jr. | .. | H02M 1/083 323/235 |
| 8,395,422 B2* | 3/2013 | Ogawa | ................. | H03K 17/063 327/109 |
| 10,211,828 B2* | 2/2019 | Gyoten | ............ | H03K 17/04123 |
| 10,615,791 B2* | 4/2020 | Le Bars | ............ | H02M 3/33573 |
| 11,677,396 B2* | 6/2023 | Lu | .................... | H03K 17/08122 327/109 |

* cited by examiner

*Primary Examiner* — Kenneth B Wells
(74) *Attorney, Agent, or Firm* — Ruggiero McAllister & McMahon LLC

(57) ABSTRACT

A voltage gate driver for a semiconductor-based transistor is provided, including a voltage generator circuit arranged for receiving a drive voltage, the voltage generator circuit includes a capacitor connected in series with a Zener diode, a cathode of the Zener diode is arranged to be connected to a gate of the semiconductor-based transistor and a bias current circuit, connected in parallel over the capacitor, the bias current circuit includes a switch and is arranged to provide a bias current to the cathode of the Zener diode based on a state of the switch, and the bias current circuit is arranged to provide the bias current to the cathode of the Zener diode when the switch is in a closed state, and arranged to prevent provision of the bias current to the cathode of the Zener diode when the switch is in an open state.

17 Claims, 5 Drawing Sheets

VOLTAGE GATE DRIVER FOR A SEMICONDUCTOR-BASED TRANSISTOR, AS WELL AS A POWER SWITCH DEVICE, AND A CORRESPONDING METHOD

CROSS-REFERENCE TO RELATED APPLICATIONS

This application claims the benefit under 35 U.S.C. § 119(a) of European Application No. 22193040.7 filed Aug. 31, 2022, the contents of which are incorporated by reference herein in their entirety.

BACKGROUND

1. Field of the Disclosure

The present disclosure is generally related to gate drivers for semiconductor based transistors and, more specifically, to increase the effective threshold voltage of the semiconductor-based transistor.

2. Description of the Related Art

Some semiconductor-based transistors have the intrinsic property that their threshold voltage is relatively low compared to, for example, silicon-based Metal Oxide Semiconductor, MOS, Field Effect Transistors, FETs. This is especially the case for Enhancement Mode Gallium Nitride High Electron Mobility Transistor, GaN HEMTs, and Silicon Carbide MOSFETs. The threshold voltage may, for example, be considered as the voltage at the gate of the transistor when a conductive channel is formed between the source and the drain of the transistor.

A voltage applied between the gate and source terminals of a semiconductor-based transistor controls the resistance of the conductive channel between the source and the drain terminal of the transistor. If the gate-source terminal of an HEMT is approximately zero, the is switched off and the resistance of the conductive channel is very high. If the gate-source terminal of the HEMT is higher than its rated threshold voltage, the HEMT is switched on and the resistance of the conductive channel is very low, typically in the mΩ range.

The HEMT may therefore exhibit the characteristics of an almost ideal controlled switch. As such, the HEMT finds broad applicability as the power switch in switch mode power supplies. Typically, these HEMTs, and other semiconductor-based transistors, have the property that their threshold voltage is much lower, and present technology has not yet found a way to increase it significantly.

Typical high voltage HEMTs have a threshold voltage in the 1V to 1.5V range, while corresponding silicon based MOSFETs can be designed to have a threshold voltage of 4V or even more. Such a low threshold voltage may be a disadvantage, especially for High power, high voltage off-line AC-DC and other high voltage switch mode power supplies as these may generate significant amounts of switching noise which may couple into the gate-source circuit of the HEMT and may cause spurious HEMT turn-on and turn-off.

The present disclosure provides for a solution to the above-described problem.

SUMMARY

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

It is an object of the present disclosure to provide for a voltage gate driver for a semiconductor-based transistor that is able to offset the off-state voltage of the HEMT, thereby effectively increasing the gate-source voltage such that it's less susceptible to noise. It is a further object of the present disclosure to provide for a corresponding power switch device and a related method.

In a first aspect, there is provided a voltage gate driver for a semiconductor-based transistor, said voltage gate driver comprising:
- a voltage generator circuit arranged for receiving a drive voltage, said voltage generator circuit comprising a capacitor connected in series with a Zener diode, wherein a cathode of said Zener diode is arranged to be connected to a gate of said semiconductor-based transistor;
- a bias current circuit, connected in parallel over said capacitor, wherein said bias current circuit comprises a switch and is arranged to provide a bias current to said cathode of said Zener diode based on a state of said switch, wherein said bias current circuit is arranged to provide said bias current to said cathode of said Zener diode when said switch is in a closed state, and arranged to prevent provision of said bias current to said cathode of said Zener diode when said switch is in an open state.

The inventors have found that it might be useful to provide an offset voltage to the gate of the HEMT, whenever the gate of the HEMT is not driven. This is especially helpful in situations wherein the HEMT is utilized as a switch, wherein the drive voltage either turns the switch ON or OFF. It was thus found that an offset voltage may be provided to the gate of the HEMT when the drive voltage is such that the switch is to be turned off.

The above is accomplished by the voltage generator circuit. The voltage generator circuit is arranged to receive the drive voltage, and comprises a capacitor which is connected in series with the Zener diode, The output of the Zener diode is arranged to be connected to the gate of the semiconductor-based transistor, i.e. the switch.

The Zener diode may be chosen such that its breakdown voltage, plus any forward voltage of a diode that is connected in series with the Zener diode, is approximately equal to the ON-state voltage of the semiconductor-based transistor. For an HEMT this may typically be 5V to 6V.

What the above effectively accomplishes is that voltage across the capacitor equals the drive voltage minus the ON-state voltage of the semiconductor-based transistor. However, whenever the drive voltage will go to zero, the capacitor will retain its charge, and the corresponding voltage will appear with a reversed polarity across the gate of the HEMT. This thus effectively establishes an offset voltage at the gate of the semiconductor-based transistor.

The inventors have found that the above-described solution may have a disadvantage. The main disadvantage is that a typical Zener diode that is used for this purpose may be very inaccurate. The breakdown voltage of the Zener diode is strongly dependent on the current flowing through the Zener diode. In essence, the output voltage of the Zener diode, at its cathode, may sag to a very low value as soon as the gate capacitance of the semiconductor-based transistor has charged up. The result is that the semiconductor-based transistor may not stay turned-ON properly.

It was found that it may be beneficial to introduce a bias current circuit. The bias current circuit is arranged to provide a bias current to the Zener diode, to mitigate the above-described disadvantage. The bias current may be connected in parallel over the capacitor, such that the capacitor discharges slowly, over the bias current circuit, to the Zener diode.

On top of the above, the inventors have found that whenever the drive voltage falls to zero, the capacitor may get fully, or nearly fully, discharged over the bias current circuit. This is a downside as this will reduce the offset voltage at the gate of the semiconductor-based transistor. This issue may become worse for reducing operating frequencies and duty cycle ratios.

As such, the inventors have found to introduce a switch in the bias current circuit, wherein the bias current circuit is arranged to provide said bias current to said cathode of said Zener diode when said switch is in a closed state, and arranged to prevent provision of said bias current to said cathode of said Zener diode when said switch is in an open state.

The main benefit is that during the OFF state of the semiconductor-based transistor, there is no need for a bias current flowing through the Zener diode such that the bias current circuit may be disabled as a whole. This is accomplished by the switch of the bias current circuit, and this ensures that the offset voltage will not slowly diminish as the capacitor will not slowly discharge over the bias current circuit.

The accuracy of the Zener diode is required during the ON-state of the semiconductor-based transistor, such that it is beneficial if the bias current is provided to the Zener diode during the ON-state. As such, the switch of the bias current circuit will be closed to ensure that a bias current is provided to the Zener diode.

The advantages of the presented solution described above are 1) that a bias current is made available to the Zener diode during the ON-state of the semiconductor based transistor, making the Zener diode more accurate, and 2) the bias current is node made available, i.e. the capacitor is not discharged, during the OFF-state of the semiconductor based transistor, thereby ensuring a steady offset voltage during the whole OFF-state period of the semiconductor based transistor.

In an example, the gate of said switch is arranged to receive said drive voltage.

The advantage of this example is that there is no need for additional control circuitry arranged for activating the switch during the intended ON-state of the semiconductor-based transistor and for deactivating the switch during the intended OFF-state of the semiconductor-based transistor. The drive voltage as such may be used for this particular purpose.

The switch of the bias current circuit may, for example, be a Metal Oxide Semiconductor, MOS, Field Effect Transistor, MOSFET.

The MOSFET may be self-biased, such that it automatically turns on and off at the correct time when driven by the drive voltage. Typically, a P-channel MOSFET would be preferred for this purpose.

A MOSFET is typically a type of insulated gate field-effect transistor that is manufactured in a semiconductor material, for example Silicon or Silicon Carbide material. The voltage at a gate terminal determines the electrical conductivity of the device. The MOSFET of the bias current circuit may be used as a switch, such that the electrical conductivity of the device is either fully conductive or fully resistive.

In a further example, the bias current circuit comprises a resistor connected in series with said switch.

The bias current circuit is connected in parallel over the capacitor of the voltage generator circuit. This means that the capacitor may discharge over the resistor, thereby provided a bias current towards the Zener diode. The switch is then deactivated to ensure that there is no bias current flowing to the Zener diode whenever the drive voltage intends to switch off the semiconductor-based transistor.

In an example, the voltage gate driver is arranged for driving a Gallium Nitride High Electron Mobility Transistor, GaN HEMT.

Typically, a negative offset voltage is provided to the gate of the GaN HEMT during the off state thereof.

In a further example, the voltage driver further comprises:
 a rise and fall time control circuit arranged for receiving said drive voltage and for reducing a rise and/or fall time of said received drive voltage.

In a further example, the anode of said Zener diode is connected to ground. The voltage driver may further comprise a diode, wherein said anode of said Zener diode is connected to ground via said diode.

It is noted that, in accordance with the present disclosure, wherever it is mentioned that a component is connected to a second component it does not mean that these components need to be directly connected to one another. In accordance with usual practice, these components are connected, directly or indirectly, to each other such that other components may be placed in between those connected components.

In a second aspect of the present disclosure, there is provided a power switch device, for example a Switch Mode Power Supply, SMPS, comprising a semiconductor-based transistor and a voltage driver in accordance with any of the previous examples.

It is noted that the advantages as explained with reference to the first aspect of the present disclosure, being the voltage gate driver, are also applicable to the second aspect of the present disclosure, being the power switch device.

In an example, the semiconductor-based transistor of the power switch device is a Gallium Nitride High Electron Mobility Transistor, GaN HEMT.

Different types of Switch Mode Power Supplies exist which may be applicable in accordance with the present disclosure, namely a buck converter, a boost converter, a buck-boost converter, a flyback converter a forward converter or anything alike. The Switch Mode Power Supply may, or may not, have an isolated topology including a transformer.

In a third aspect of the present disclosure, there is provided a method of operating a voltage driver in accordance with any of the previous examples, wherein said method comprises the steps of:
 providing, by said bias current circuit, said bias current to said cathode of said Zener diode when said switch is in said closed state, and
 preventing, by said bias current circuit, said bias current to said cathode of said Zener diode when said switch is in said open state.

It is noted that the advantages as explained with reference to the first aspect of the present disclosure, being the voltage gate driver, are also applicable to the second aspect of the present disclosure, being the method of operating a voltage driver.

Although the solution is described here with reference to n-channel devices which are turned on by positive gate voltages, it also applies to p-channel devices with all the voltages reversed. For example, it can apply to a p-channel MOSFET, where the usual zero-to-negative gate drive voltage can be shifted above zero during the device's off time to make it positive and increase the effect threshold voltage of the MOSFET.

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

The above and other aspects of the disclosure will be apparent from and elucidated with reference to the examples described hereinafter.

DETAILED DESCRIPTION

Figure 1:
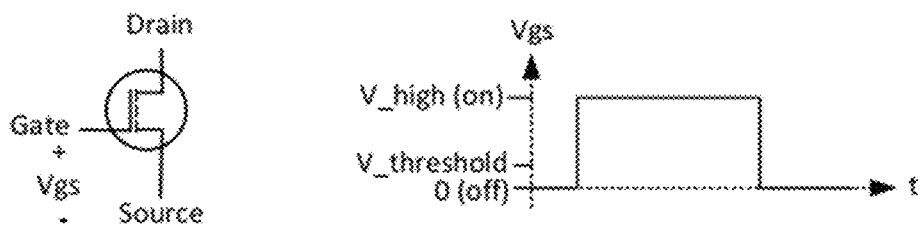
FIG. 1 discloses an example of a semiconductor-based transistors along with its gate voltage definitions.

It is noted that in the description of the figures, same reference numerals refer to the same or similar components performing a same or essentially similar function.

A more detailed description is made with reference to particular examples, some of which are illustrated in the appended drawings, such that the manner in which the features of the present disclosure may be understood in more detail. It is noted that the drawings only illustrate typical examples and are therefore not to be considered to limit the scope of the subject matter of the claims. The drawings are incorporated for facilitating an understanding of the disclosure and are thus not necessarily drawn to scale. Advantages of the subject matter as claimed will become apparent to those skilled in the art upon reading the description in conjunction with the accompanying drawings.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

FIG. 1 discloses an example of a semiconductor-based transistor along with its gate voltage definitions.

The transistor shown at the left-hand side may be any of a HEM, a MOSFET or any other type of transistor. The transistor comprises a gate "Gate", a source "Source" and a drain "Drain".

In accordance with the present disclosure, the transistor may be turned on or turned off based on the gate-source voltage "Vgs". The transistor will then basically operate as a switch, wherein either the drain source connection is low ohmic (turned on) or the drain source connection is high ohmic (turned off).

The diagram at the right-hand side shows the threshold voltage of the transistor "V_threshold", as well as the drive signals on the gate of the transistor. The transistor may be driven with a high voltage, i.e. "V_high", which high voltage is much higher compared to the threshold voltage thereby accomplishing that the transistor is turned on. The transistor may be driven with a low voltage, i.e., a zero voltage "0", which is lower compared to the threshold voltage thereby accomplishing that the transistor is turned off. The above is visually represented in FIG. 1.

Figure 2:
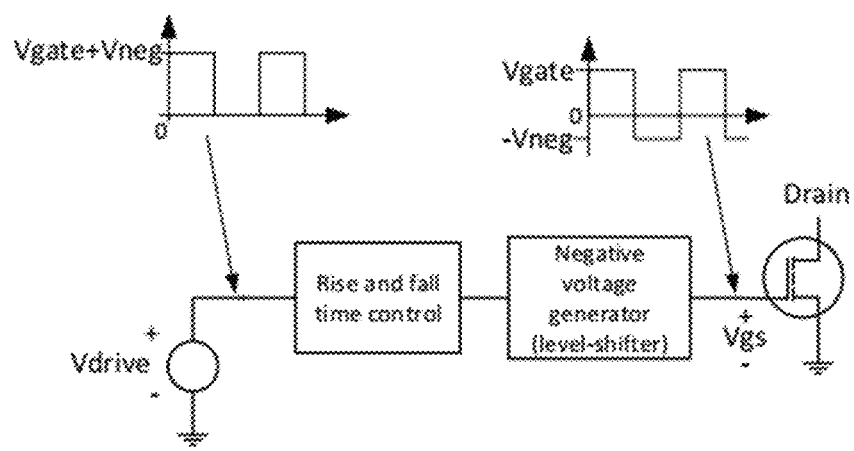
FIG. 2 discloses a conceptual diagram of a voltage gate driver in accordance with the present disclosure.

FIG. 2 discloses a conceptual diagram of a voltage gate driver in accordance with the present disclosure.

The inventors have found that for certain semiconductor-based transistors, for example HEMTs, the threshold voltage may be relatively low. This is also visually depicted in FIG. 1. One of the drawbacks is that any noise that is introduced may cause the gate source voltage, Vgs, to unintentionally rise to above the threshold voltage thereby turning the semiconductor-based transistor on. This is undesired.

As such, a solution was found in which a voltage generator circuit was introduced in between the generated drive voltage and the gate of the semiconductor-based transistor. In the embodiment shown in FIG. 2, the voltage generator circuit effectively reduces the voltage at the gate of the semiconductor-based transistor whenever the drive voltage is low. This is indicated with the reference "−Vneg".

The voltage generator circuit may comprise a capacitor connected in series with a Zener diode, wherein a cathode of said Zener diode is arranged to be connected to a gate of said semiconductor-based transistor. This circuit may be considered as a voltage divider, such that the drive voltage is divided over the capacitor and the Zener diode. As such, the drive voltage equals the "Vgate+Vneg", while the voltage at the gate is "Vgate", which equals the voltage over the Zener diode. The voltage over the capacitor then equals "Vneg".

During the off-state, i.e., when the drive voltage is zero, the polarity of the voltage over the capacitor flips, such that a negative voltage, "−Vneg", is provided to the gate of the semiconductor-based transistor.

The voltage gate driver may further comprise a rise and fall time control circuit arranged for receiving said drive voltage and for reducing a rise and/or fall time of said received drive voltage.

Figure 3:
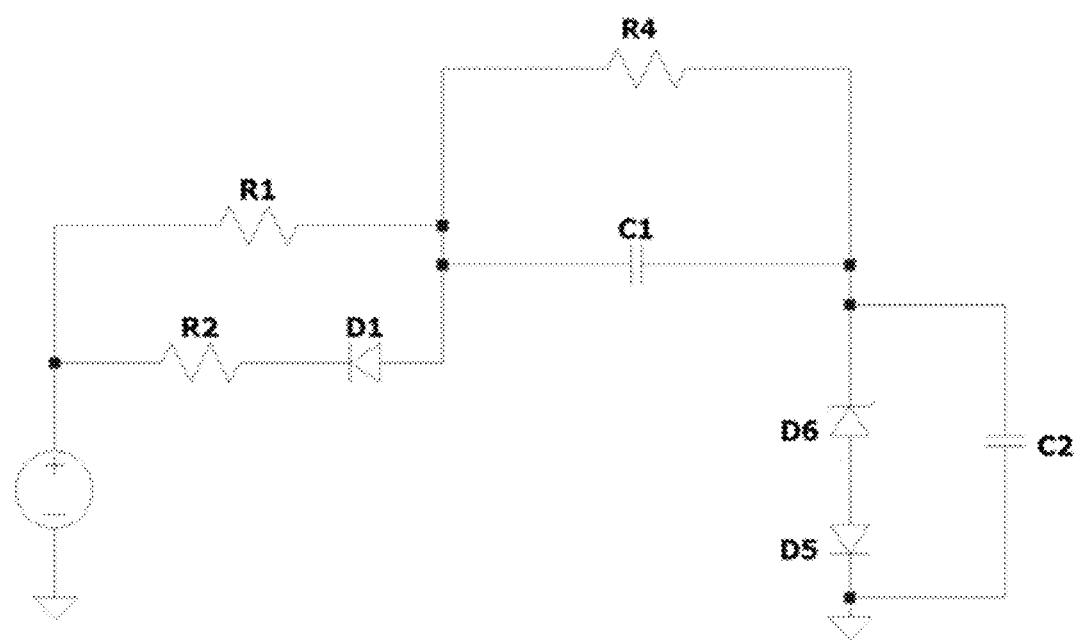
FIG. 3 discloses a voltage gate driver in accordance with the prior art.

FIG. 3 discloses a voltage gate driver in accordance with the prior art.

The rise and fall time control circuit may be indicated with the components having reference numeral R1, R2 and D1. They ensure that the slope of the drive voltage is reduced.

A voltage generator circuit is arranged and is constituted by the capacitor C1, the Zener diode D6 and the additional diode D5. The voltage over the in series connected Zener diode D6 and the further diode D5 is provided to the gate of the semiconductor-based transistor. The capacitance of the gate is visually indicated by the capacitor C2.

A bias current circuit is present which constitutes of a resistor R4 placed in parallel over the capacitor C1. The bias current is accomplished in that the capacitor C1 is discharged over R4 and this discharge current is provided to the Zener diode. It is noted that the gate of the semiconductor-based transistor is considered to have a very high impedance such that this bias current will flow through the Zener diode.

Figure 4:
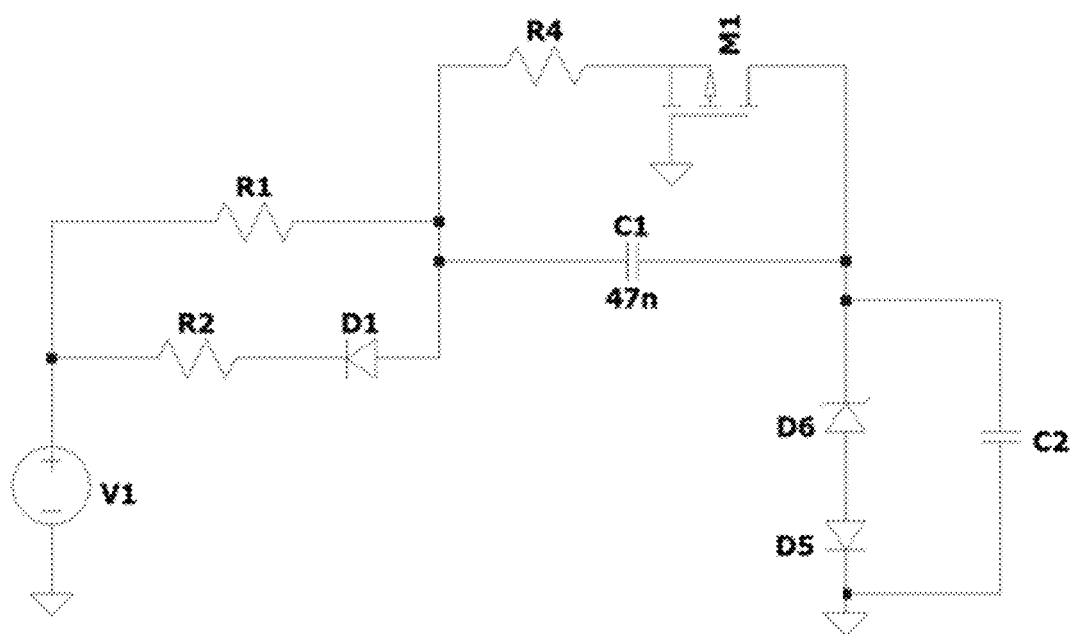
FIG. 4 discloses an example of a voltage gate driver in accordance with the present disclosure.

FIG. 4 discloses an example of a voltage gate driver in accordance with the present disclosure.

One of the downsides of the bias current as disclosed above, is that the capacitor C1 will be discharged whenever the drive voltage is low. This has an effect on the voltage provided to the gate of the semiconductor-based transistor. The effect is that whenever the capacitor is fully discharged, there is no longer an offset voltage, i.e. negative voltage, present any more.

The downside is especially noticeable for drive voltages having a low frequency, as this could lead to situations in which the capacitor is fully discharged over R4 during a relatively long off-state of the transistor.

The inventors have found a beneficial way to combat the disadvantage provided above, in that a switch M1 is provided in series with the resistor R4, wherein the switch is activated during the ON-state, i.e. whenever the drive voltage is high, such that a bias current is provided to the Zener diode, and in that the switch is deactivated during the OFF-state, i.e. whenever the drive voltage is low, such that no bias current is provided to the Zener diode. The capacitor will then not be able to discharge over resistor R4 during the OFF state, such that the offset voltage at the gate of the semiconductor based transistor can be maintained for a longer timer period.

Figure 5:
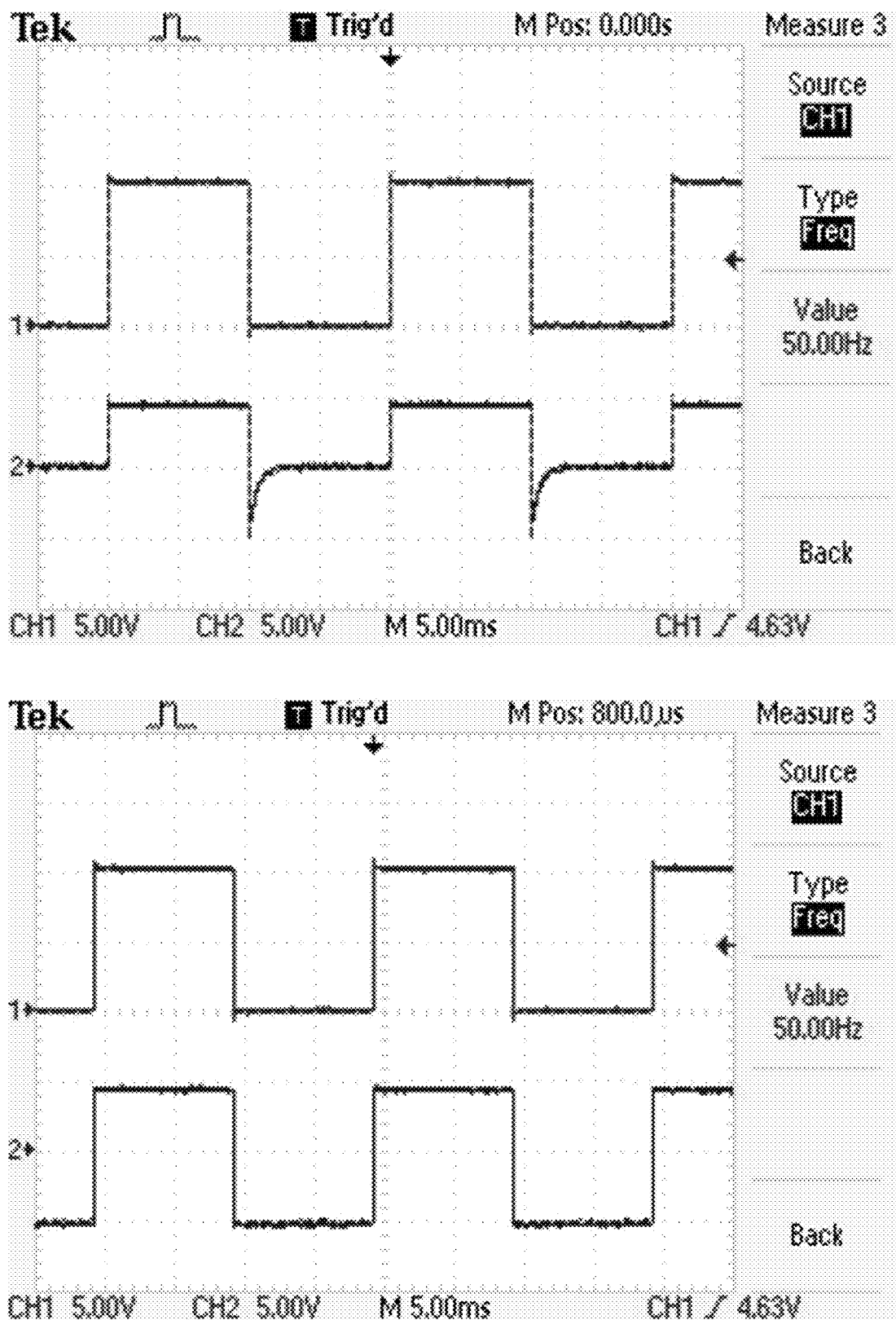
FIG. 5 discloses voltage diagrams of the voltage gate driver in accordance with the prior art and of the voltage gate driver in accordance with the present disclosure.

FIG. 5 discloses voltage diagrams of the voltage gate driver in accordance with the prior art and of the voltage gate driver in accordance with the present disclosure.

At the left-hand side of FIG. 4 a timing diagram of a conventional gate driver is shown, and at the right hand side the voltage gate driver in accordance with the present disclosure is shown.

At the left-hand side it is clearly shown that the negative voltage applied to the gate of the semiconductor based transistor during its OFF state cannot be maintained, as this voltage gradually returns back to zero. Again, this is caused by the discharge of the capacitor over the resistor.

At the right-hand side it is clearly shown that the negative voltage applied to the gate of the semiconductor based transistor during its OFF state can be maintained much longer, as the capacitor is no longer able to discharge itself over resistor R4.

In the above, the present disclosure is explained with respect to a semiconductor-based transistor being an HEMT. It is noted that the present disclosure may be applicable for any semiconductor-based transistor having a gate, source and drain terminal.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope thereof.

What is claimed is:

1. A voltage gate driver for a semiconductor-based transistor, the voltage gate driver comprising:
   a voltage generator circuit arranged to receive a drive voltage, the voltage generator circuit comprising a capacitor connected in series with a Zener diode, wherein the Zener diode has a cathode that is arranged to be connected to a gate of the semiconductor-based transistor and the capacitor;
   a bias current circuit connected in parallel with the capacitor, wherein the bias current circuit comprises a switch, the switch being a Metal Oxide Semiconductor Field Effect Transistor (MOSFET), and is arranged to provide a bias current to the cathode of the Zener diode based on a state of the switch, wherein the bias current circuit is arranged to provide the bias current to the cathode of the Zener diode when the switch is in a closed state, and arranged to prevent provision of the bias current to the cathode of the Zener diode when the switch is in an open state, and wherein the switch has a gate that is arranged to receive the drive voltage.

2. The voltage gate driver in accordance with claim 1, wherein the MOSFET is a P-channel MOSFET.

3. The voltage gate driver in accordance with claim 1, wherein the bias current circuit comprises a resistor connected in series with the switch.

4. The voltage gate driver in accordance with claim 1, wherein the semiconductor-based transistor is arranged to drive a Gallium Nitride High Electron Mobility Transistor (GaN HEMT).

5. The voltage gate driver in accordance with claim 1, wherein the Zener diode has an anode that is connected to ground.

6. A power switch device comprising the voltage gate driver for the semiconductor-based transistor in accordance with claim 1.

7. The voltage gate driver in accordance with claim 2, wherein the bias current circuit comprises a resistor connected in series with the switch.

8. The voltage gate driver in accordance with claim 2, wherein the semiconductor-based transistor is arranged to drive a Gallium Nitride High Electron Mobility Transistor (GaN HEMT).

9. The voltage gate driver in accordance with claim 2, wherein the Zener diode has an anode that is connected to ground.

10. A power switch device comprising the voltage gate driver for the semiconductor-based transistor in accordance with claim 2.

11. The voltage gate driver in accordance with claim 3, wherein the semiconductor-based transistor is arranged to drive a Gallium Nitride High Electron Mobility Transistor (GaN HEMT).

12. The voltage gate driver in accordance with claim 3, wherein the Zener diode has an anode that is connected to ground.

13. The voltage gate driver in accordance with claim 5, wherein the voltage gate driver further comprises a diode, wherein the anode of the Zener diode is connected to ground via the diode, and wherein the anode of the diode is connected to the anode of the Zener diode.

14. A power switch device in accordance with claim 7, wherein the voltage gate driver for the semiconductor-based transistor is a Gallium Nitride High Electron Mobility Transistor (GaN HEMT) or a Silicon Carbide MOSFET.

15. A method of operating the voltage gate driver in accordance with claim 1, wherein the method comprises the steps of:
   providing, by the bias current circuit, the bias current to the cathode of the Zener diode when the switch is in the closed state, and
   preventing, by the bias current circuit, the bias current from flowing to the cathode of the Zener diode when the switch is in the open state.

16. A method of operating the voltage gate driver in accordance with claim 2, wherein the method comprises the steps of:
   providing, by the bias current circuit, the bias current to the cathode of the Zener diode when the switch is in the closed state, and
   preventing, by the bias current circuit, the bias current from flowing to the cathode of the Zener diode when the switch is in the open state.

17. A method of operating the voltage gate driver in accordance with claim 3, wherein the method comprises the steps of:
   providing, by the bias current circuit, the bias current to the cathode of the Zener diode when the switch is in the closed state, and
   preventing, by the bias current circuit, the bias current from flowing to the cathode of the Zener diode when the switch is in the open state.

\* \* \* \* \*